(12) United States Patent
Ma et al.

(10) Patent No.: US 6,346,725 B1
(45) Date of Patent: Feb. 12, 2002

(54) CONTACT-LESS ARRAY OF FULLY SELF-ALIGNED, TRIPLE POLYSILICON, SOURCE-SIDE INJECTION, NONVOLATILE MEMORY CELLS WITH METAL-OVERLAID WORDLINES

(75) Inventors: Yueh Yale Ma, Los Altos Hills; Takahiro Fukumoto, Sunnyvale, both of CA (US)

(73) Assignee: Winbond Electronics Corporation, Hsinchu (TW)

( * ) Notice: Subject to any disclaimer, the term of this patent is extended or adjusted under 35 U.S.C. 154(b) by 0 days.

(21) Appl. No.: 09/083,770

(22) Filed: May 22, 1998

(51) Int. Cl.[7] .................................. H01L 29/788
(52) U.S. Cl. ................................. 257/316; 257/900
(58) Field of Search ................. 257/316, 900, 257/411, 401

(56) References Cited

U.S. PATENT DOCUMENTS

| | | | |
|---|---|---|---|
| 4,638,347 A | * 1/1987 | Iyer ........................... | 257/900 |
| 4,639,893 A | 1/1987 | Eitan .......................... | 365/185 |
| 5,168,465 A | 12/1992 | Harari ......................... | 257/320 |
| 5,280,446 A | * 1/1994 | Ma et al. ..................... | 257/316 |
| 5,408,115 A | 4/1995 | Chang ......................... | 257/324 |
| 5,422,504 A | 6/1995 | Chang et al. ................. | 257/316 |
| 5,554,869 A | 9/1996 | Chang ......................... | 257/316 |
| 5,702,965 A | * 12/1997 | Kim ............................ | 438/264 |
| 5,734,607 A | * 3/1998 | Sung et al. ................... | 257/316 |
| 5,864,501 A | * 1/1999 | Lee ........................... | 365/185.09 |

* cited by examiner

Primary Examiner—Mark V. Prenty
(74) Attorney, Agent, or Firm—Townsend and Townsend and Crew LLP (57) ABSTRACT

A contact-less array of self-aligned, triple polysilicon, source side injection, nonvolatile memory cells with metal-overlaid wordlines includes: a plurality of pairs of stacks of first, second and third layer polysilicon arrange in rows; a drain region between the two stacks in each pair of polysilicon stacks, the drain regions being self-aligned to the edges of the two stacks; and a source region between each of the two adjacent pairs of polysilicon stacks, the source regions being self-aligned to side-wall spacers formed adjacent to edges of the polysilicon stacks such that each source region is laterally spaced an equal distance from the edges of the two stacks of polysilicon between which the source region is located.

17 Claims, 7 Drawing Sheets

CONTACT-LESS ARRAY OF FULLY SELF-ALIGNED, TRIPLE POLYSILICON, SOURCE-SIDE INJECTION, NONVOLATILE MEMORY CELLS WITH METAL-OVERLAID WORDLINES

BACKGROUND

1. Field of the Invention

The present invention relates to semiconductor non-volatile memory technology and more particularly to a structure of and a method for producing a contact-less array of self-aligned, triple polysilicon, source-side injection, flash memory cells.

2. Description of Related Art

Figure 1A:
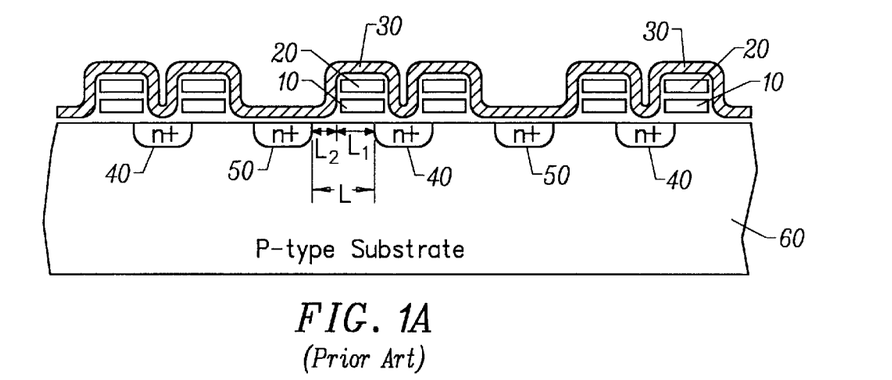
FIG. 1A is a cross section view of a row of prior art triple polysilicon, source side injection, flash EPROM cells.
Figure 1B:
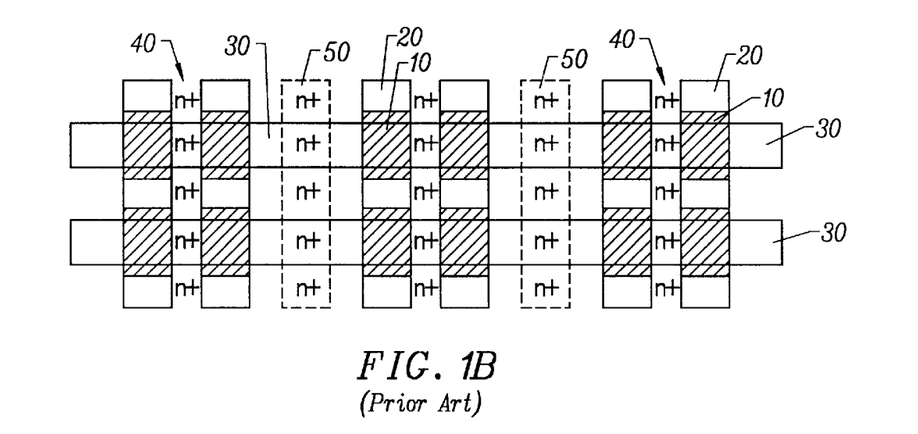
FIG. 1B is a layout diagram of two rows of flash EPROM cells, each row corresponding to the row of cells in FIG. 1A.
Figure 1C:
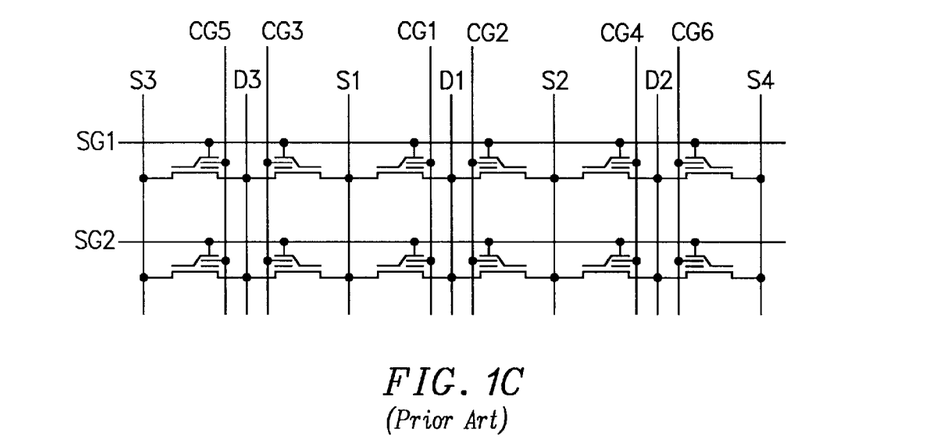
FIG. 1C is a circuit representation of the two rows of flash EPROM cells in FIG. 1B.

FIGS. 1A–1C show different perspectives of a contact-less array of triple-polysilicon, source side injection, flash EPROM cells disclosed by Ma et al. in U.S. Pat. No. 5,280,446 issued Jan. 18, 1994, and incorporated herein by reference.

In FIG. 1A, each cell includes a drain diffusion 40, a source diffusion 50, a floating gate 10 (first layer poly), a control gate 20 (second layer poly), and a select gate 30 (third layer poly). The floating gate 10 and the control gate 20 extend over a first portion $L_1$ of the channel region L. The source diffusion 50 is laterally spaced a distance $L_2$ from the floating gate 10. $L_2$ forms a second portion of the channel region L. The drain diffusion 40 is self-aligned with the stack of floating gate 10 and control gate 20. This cell structure is commonly referred to as "split gate" because it merges two serially connected transistors (i.e., the select gate transistor and the floating gate transistor) into a single memory cell. The select gate 30 extends in a direction which is perpendicular to a drain extension, and runs over the drain diffusion 40, the control gate 20, the portion $L_2$ of the channel region L, and the source diffusion 50 of every cell in a row of such cells.

A layout diagram of two rows of memory cells, each row corresponding to the cross section view of FIG. 1A, is shown in FIG. 1B. The floating gates are shown as the cross hatched regions 10; the drain diffusions are connected together forming a column 40 (drain bitline); the source diffusions are connected together forming another bitline column 50 (source bitline); the control gates are connected together forming yet another column 20 (polysilicon line); and the select gates are connected together forming a row 30 (wordline) perpendicular to the columns.

The drain and source diffusion bitlines are strapped with metal lines (not shown) to minimize the resistance associated with the diffusion bitlines. This is necessary in order to achieve the desired read and programming characteristics. Contacts are used to strap the diffusion bitlines with metal (e.g., one contact may be used every 64 or 128 cells). The number of contacts used along these bitlines depends on the technology and performance requirements. This type of array architecture is commonly referred to as a contact-less array because, unlike the conventional common source array architecture (wherein one contact is required for every two cells), the contact design rules do not limit the size of the cell. Therefore, scaling of the memory cell in such contact-less array architecture is made easier.

FIG. 1C is a circuit diagram of two rows and six columns of memory cells corresponding to the cross section and layout views in FIGS. 1A and 1B, respectively. This diagram shows the mirror image formation of the memory cells along each row, i.e., every two adjacent memory cells along a row are mirror images of one another.

The read, programming and erase operations of this array architecture are described in detail in the above-mentioned '446 patent. Suffice it to state that programming is achieved through source side injection, and erasing is achieved through tunneling between the floating gate and the drain diffusion.

This flash EPROM approach possesses a number of drawbacks. First, during the deposition and definition of select gates 30 (FIGS. 1A and 1B), poly stringers form between adjacent rows of select gates 30, causing electrical shorts between them. The stringers form because the select gates 30 overlay a tall stack of first and second layer poly (approximately 4,000 Å high), and the conventional select gate etch, used in both the periphery and the array regions, does not fully remove the third layer poly in the array region, leaving behind poly stringers. Thus, additional etching in the array region is needed. Since the third layer poly in the periphery region does not require the over etching, an additional masking step is needed.

Second, the second layer poly (control gate 20) can not receive tungsten silicide ($WSi_2$) due to the step height of the poly stack. Incorporating a tungsten silicide layer in the already tall stack of triple poly only exacerbates the problems associated with this stack, such as the stringers. However, without tungsten silicide, the RC time constant associated with control gates 20 is large, causing slow programming and erase functions.

Third, in high density memory devices, due to the typically large RC time delay associated with the polysilicon wordlines (select gates 30), strapping of the polysilicon wordlines with metal is required in order to achieve reasonable address access time. Such strapping requires drop contacts for making electrical contact between the poly wordline and the metal strap. The drop contacts result in larger array area.

Figure 2A:
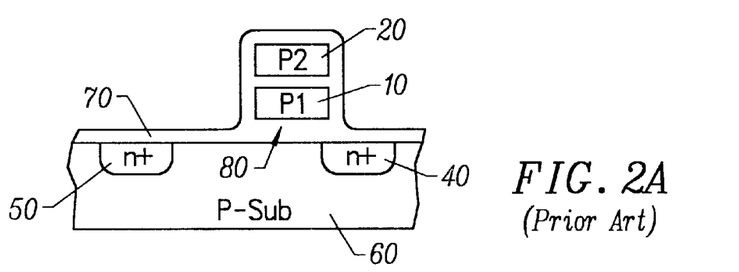
FIGS. 2A–2D show the process steps leading to "cusping" of the select gate 30.
Figure 2B:
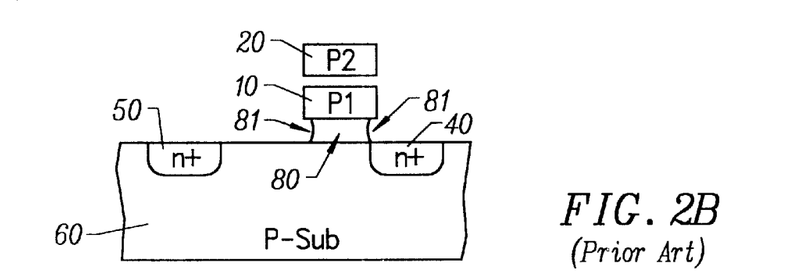
Figure 2C:
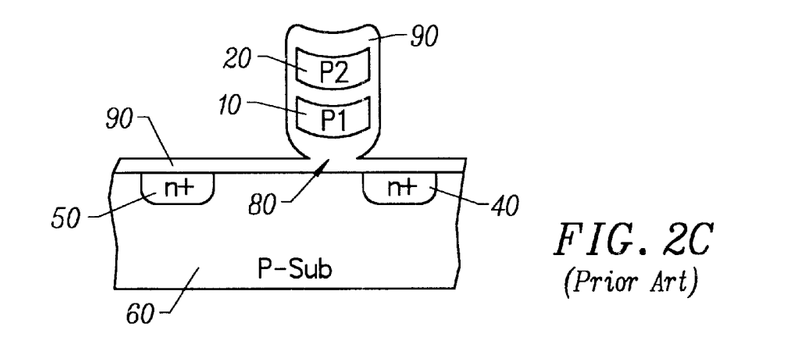
Figure 2D:
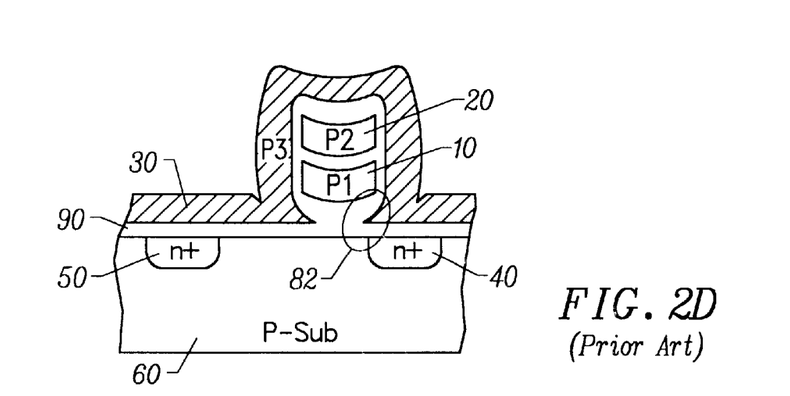

Fourth, during the select gate oxidation step wherein the select gate oxide is formed, a phenomenon, commonly referred to as "cusping", occurs which results in a number of reliability problems. FIGS. 2A–2D illustrate this phenomenon. FIG. 2A shows the cross section of a stack of first layer polysilicon 10 (poly 1) and second layer polysilicon 20 (poly 2), the tunnel oxide 80 under poly 1, and the overlying layer of oxide 70. In FIG. 2B, the oxide layer 70 is removed through a dip off process, which as shown, results in removal of portions 81 of the tunnel oxide 80 under the outside edges of poly 1. In FIG. 2C, the gate oxidation step wherein gate oxide 90 is grown over the entire cell, results in raising of the outside edges of both poly 1 and poly 2. This phenomenon is commonly referred to as "smiling poly". When the third layer of poly 30 (poly 3) is deposited over the gate oxide 90, as shown in FIG. 2D, the contours of poly 1 result in "cusping" of poly 3 (i.e., poly 3 is pinched in the areas under the two ends of poly 1 as shown in the encircled region 82).

Cusping of poly 3 results in a number of reliability problems. First, the raised edges of poly 1 result in thicker tunnel oxide under these edges. This in turn results in slower erase since erase occurs through the tunnel oxide region between poly 1 and the drain diffusion 40 in the area marked as 82. Second, the oxide under the edges of poly 1 is formed from oxidized poly 1, which is a poor quality oxide. Such oxide possesses many trap sites which degrade the cycling characteristics of the device. Third, the cusping of poly 3 causes device failures due to charge loss during such reliability procedures as high voltage, high temperature dynamic burn-in cycles. Fourth, the cusping causes early retention failures during retention bake because the sharp corner of the cusp results in high fields.

SUMMARY

In accordance with the present invention, a fully self-aligned, triple polysilicon, source side injection, nonvolatile memory cell suitable for use in a contact-less array of such cells wherein wordlines are overlaid with metal, as well as a method for producing the same is provided.

The following outlines one set of process steps for producing such contact-less array of nonvolatile memory cells in a silicon substrate: (a) a plurality of pairs of stacks of first and second layer polysilicon are formed along a row over the substrate; (b) a drain region is then formed in the substrate between the two stacks in each pair of polysilicon stacks, each drain region being self-aligned to the edges of the two stacks; (c) side-wall spacers are then formed adjacent to edges of each polysilicon stack; and (d) a source region is then formed in the substrate between each of two adjacent pairs of polysilicon stacks, the source region being self-aligned to the edges of the oxide spacers.

In one embodiment, a composite layer of, in the order from bottom to top, HTO-Nitride-Polysilicon (ONP) is formed over the array immediately after step (b). After step (d), the array surface is planarized using an insulating material, and then a trench is created over the row of cells by selectively removing the insulating material from over the row of cells. Next, the ONP composite layer is converted to an ONO composite layer, and the ONO composite layer is then anisotropically etched to form side-wall spacers adjacent to the edges of the polysilicon stacks. Select gate oxide is then grown over the row of cells, after which a third layer of polysilicon is formed over the select gate oxide. Finally, the third layer of polysilicon is overlaid with a layer of metal.

In yet another embodiment, a contact-less array of nonvolatile memory cells includes: a row of pairs of stacks of first and second polysilicon layers over a silicon substrate, the first polysilicon layer being insulated from the substrate, and the second polysilicon layer being insulated from the first polysilicon layer; a drain region in the substrate between the two stacks in each pair of polysilicon stacks, the drain region being aligned to the edges of the two stacks; a source region in the substrate between two adjacent pairs of polysilicon stacks, the source region being self-aligned to side-wall spacers formed adjacent to edges of the polysilicon stacks such that the source region is laterally spaced an equal distance from the edges of the two stacks of polysilicon between which the source region is located; and a third layer of polysilicon over but insulated from the row of polysilicon stacks and the silicon substrate, the third layer of polysilicon forming a wordline in the array.

One feature of the present invention is that the polysilicon layer in the ONP composite layer helps achieve a self-aligned source region by facilitating the use of oxide spacers in the source formation step.

Another feature is that a fully planarized array is obtained by utilizing the ONP composite layer in combination with the CMP technology, thereby eliminating all complications typical to non-planarized cell technologies, such as (i) the stringer problem discussed above and (ii) the inability to form tungsten polycide over the control gate due to the tall height of the polysilicon stack.

Yet another feature is that the "ONO spacers" adjacent each stack of polysilicon prevent cusping of the third layer polysilicon thereby eliminating reliability problems associated with such cusping.

Yet another feature is that polysilicon wordlines are strapped with metal without use of drop contacts, thereby minimizing the wordline RC time delay without any area penalty.

Yet another feature is that the processing steps of the present invention can easily be integrated with conventional ETOX processes, thereby facilitating transporting these process steps to any manufacturing foundry using the ETOX process.

These and other features and advantages of the present invention will become more apparent from the following description and the accompanying drawings.

DESCRIPTION OF PREFERRED EMBODIMENTS

FIGS. 3A–3L show one embodiment of the present invention. These figures depict the cross section views at succeeding stages of fabricating a sample portion of a row of flash EPROM cells. These memory cells are split gate cells serially connected in mirror image formation along each row in a contact-less array of such cells, similar to that shown in FIG. 1C.

Figure 3A:
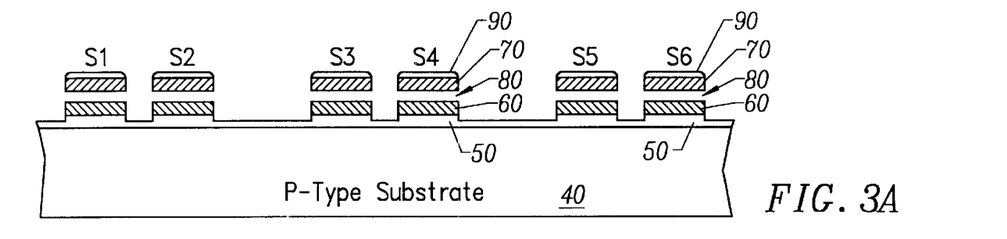
FIGS. 3A–3E and 3G–3L are cross section views of a sample portion of a row of memory cells at succeeding stages of fabrication in accordance with one embodiment of the present invention.

FIG. 3A shows a cross section of six polysilicon stacks S1–S6 after the initial few processing steps. These stacks of poly are formed over the substrate 40 in accordance with the conventional ETOX process. Each stack includes the tunnel oxide 50, the first layer polysilicon 60 (poly 1), the second layer polysilicon 70 (poly 2), and the dielectric layer 80 (which typically comprises a composite layer of oxide-nitride-oxide). Also, the poly 2 layer is overlaid with tungsten silicide (Wsi$_2$) not shown. In this and all subsequent figures, layer 70 is presumed to include a layer of tungsten silicide. Finally, layer 70 is overlaid with the oxide layer 90 which is High Temperature Oxide (HTO).

The poly stacks S1–S6 are spaced in a specific manner in order to facilitate the mirror image formation of the split gate cells. As shown, the polysilicon stacks are formed in pairs wherein the distance between the two stacks in each pair is smaller than the distance between adjacent pairs (e.g., the distance between stacks S1 and S2 is shorter than the distance between stacks S2 and S3). In one embodiment the distance between S2 and S3 is three times that between S1 and S2.

Figure 3B:
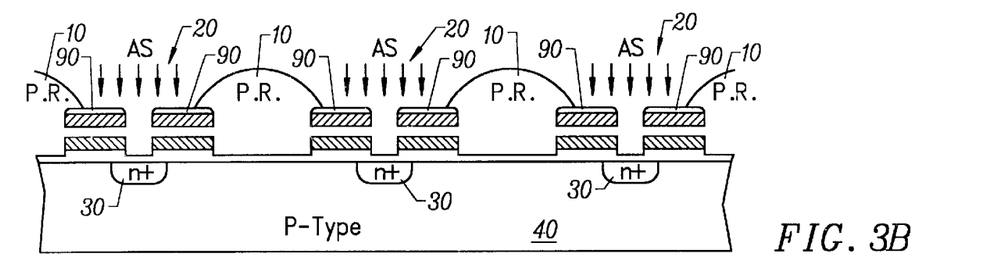

In FIG. 3B, an implant step is carried out to form the n+ buried bitline drain diffusions 30. Photoresist layer 10 along with the poly stacks are used to cover those areas of the substrate surface that are not to receive the arsenic implant 20. The two stacks in each pair of poly stacks (e.g., stacks S1 and S2) define a window through which arsenic 20 is implanted into the substrate 40. In this manner, the inner edges of adjacent stacks of ploy, such as S1 and S2, define the outer boundaries of the drain diffusions 30, hence the term self-aligned drain diffusions. Similar to conventional virtual ground arrays, bitline diffusions 30 are shared by two adjacent memory cells. However, unlike conventional virtual ground arrays wherein each diffusion my serve as both a drain and a source diffusion, diffusions 30 serve only as drain diffusions.

Figure 3C:
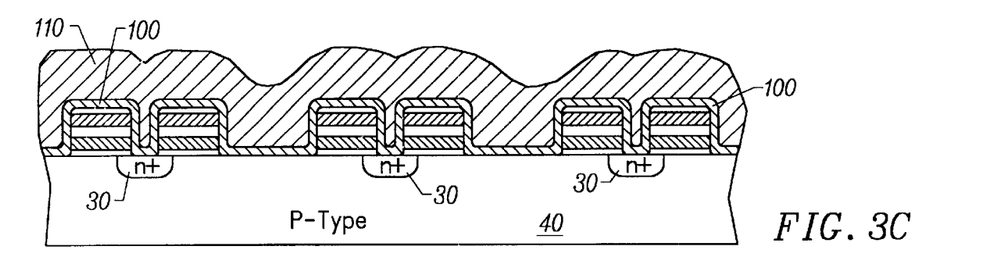

In FIG. 3C, a composite layer of ONP (Oxide-Nitride-Polysilicon) 100 is deposited over the entire array, and then an undoped layer of CVD oxide 110 is deposited over the ONP composite layer 100. The ONP composite layer 100 consists of, in the order from bottom layer to top layer, 100 Å of High Temperature Oxide (HTO) or thermal oxide, 150 Å of Nitride and 100–500 Å of intrinsic polysilicon. For this embodiment, a thickness of 400 Å is best suited for the intrinsic poly layer. The intrinsic poly serves as a buffer layer, protecting the underlying ON (Oxide-Nitride) composite layer from exposure to subsequent processing steps.

Figure 3D:
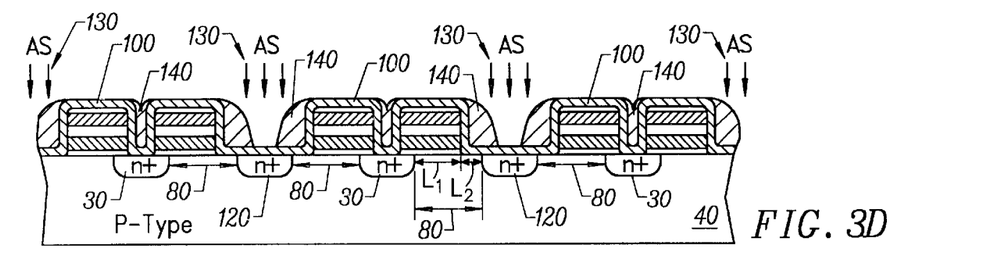

The undoped CVD oxide layer 110 may be TEOS with a thickness in the range of 4,000–10,000 Å. In FIG. 3D, the oxide layer 110 is anisotropically etched back until the top buffer polysilicon layer of the ONP composite layer 100 is first exposed. In this manner, oxide spacers 140 are formed. Note that oxide spacers 140 completely fill the openings over the drain diffusions 30 (e.g., between stacks S1 and S2) due to the narrow width of the openings. But the oxide spacers 140 create a window in the opening between two adjacent pairs of polysilicon stacks (e.g., between stacks S2 and S3).

Next, self-aligned n+ buried bitline source diffusions 120 are formed by implanting arsenic 130 through the windows formed by oxide spacers 140. In this manner, the edges of each pair of window-forming oxide spacers 140 define the boundaries of source diffusions 120, hence the term self-aligned source diffusions. Drain regions 30 do not receive the implant 130 since the openings directly over these regions are filled with oxide. Similar to drain diffusions 30, each diffusion 120 serves strictly as a source diffusion and is shared by two adjacent memory cells along the wordline dimension.

The split gate configuration of each cell can now be recognized in FIG. 3D even though the select gate is not yet present. For example, the fourth cell from the left comprises the poly stack S4, the drain diffusion 30 immediately to the left of stack S4, the source diffusion 120 immediately to the right of stack S4, and the channel region 80 between the two diffusion regions. As shown, the channel region 80, commonly referred to as $L_{eff}$, is made up of a portion $L_1$ which is directly under the poly stack S4, and the remaining portion $L_2$. As in any split gate cell, this cell is made up of a floating gate transistor (represented by the $L_1$ portion of the channel region 80) in series with a select gate transistor (represented by the $L_2$ portion of the channel region 80).

The thickness selected for the oxide layer 110 in FIG. 3C impacts the length of the channel region 80, and more specifically the portion $L_2$. Generally, a thicker oxide layer 110 results in a longer $L_2$. Therefore, depending upon the desired $L_2$, an appropriate thickness is selected for the oxide layer 110. The thickness of the oxide layer 110 is in the range of 5000 Å–7000 Å, and the preferred thickness for this embodiment is 7000 Å.

In carrying out the steps depicted by FIGS. 3C and 3D, two parameters which effect the performance of the memory cell are taken into account: (1) the oxide spacer etch back uniformity across the wafer, and (2) the oxide to poly selectivity. The oxide spacer etch back uniformity is typically about ±10% (a total of 20%) across the wafer. This means that in etching back, for example, 7,000 Å of oxide 110, when the first exposed buffer poly surface is detected, other areas on the wafer may have as much as 1,400 Å (20% of 7,000 Å) of oxide 110 remaining. Therefore, additional etching is required to remove the remaining oxide.

The additional etching of the oxide 110 however, results in removal of a certain amount of the buffer poly layer in those areas where the buffer poly is exposed earlier. The oxide to poly selectivity is typically about 30:1, which means for every 30 Å of oxide that is etched back, 1 Å of polysilicon is lost. Accordingly, in etching back the remaining 1,400 Å of HTO in the above example, approximately 120 Å of the buffer poly (30% of 400 Å) is lost in those areas where the buffer poly is first exposed. Note that the thickness of the buffer poly layer must be carefully selected to take into account such losses in thickness.

Accordingly, the buffer poly layer is used to indicate when to stop etching the oxide 110, and also to "buffer" or protect the underlying ON composite layer, which as will be seen, forms part of the insulating layer between the second and third poly layers. A defect-free insulating layer minimizes the risk of oxide damage during device operations in which high voltage is applied across poly 2 and poly 3.

In accordance with the above steps, both the source diffusions 120 and the drain diffusions 30 are formed in a fully self-aligned manner. As such, $L_{eff}$ variations across the wafer due to misalignments are minimized resulting in a more predictable process. More importantly, scaling of such memory cell is achieved more easily.

Figure 3E:
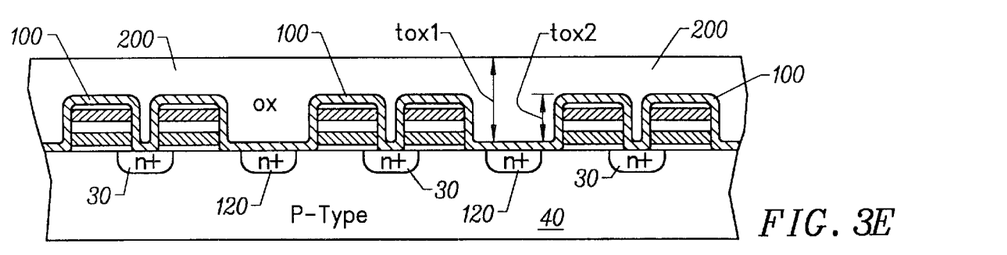

Next, through a two step process, the surface of the array region is planarized, as shown in FIG. 3E. First, 10,000 Å–15,000 Å of undoped oxide is deposited over the entire array through a Chemical Vapor Deposition (CVD) step. Second, using the well known technique of Chemical Mechanical Polish (CMP), or other planarization techniques such as resist etch back, the entire surface area of the array is planarized. These two steps, in effect, result in filling the cavities in the array with Oxide 200 thereby producing an even surface. After completion of the two steps, the oxide thickness, indicated as $t_{ox1}$ in FIG. 3E, is in the range of 5000 Å–7000 Å. It is not necessary to remove the oxide spacers 140 prior to carrying out these two steps. However, the spacers 140 may be removed through a Hydride Florid (HF) dip etching step if desired. Note that the buffer poly is unaffected by this etching process because, wet etch does not attack polysilicon.

Figure 3F:
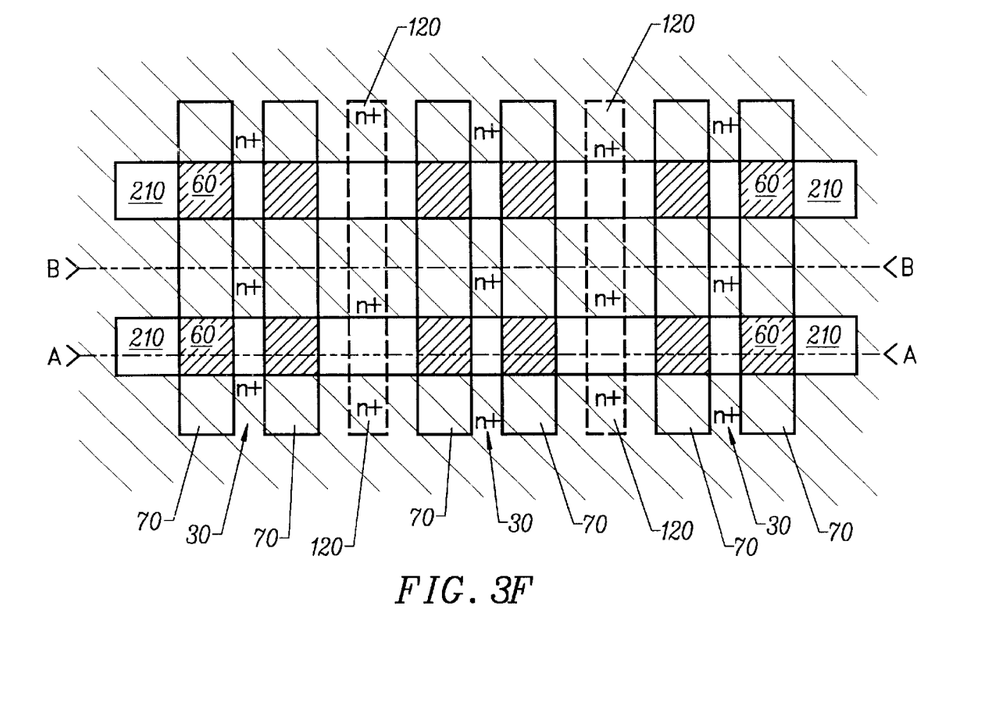
FIG. 3F is a layout diagram corresponding to the process step wherein trenches 210 are formed in the oxide.

With a planarized array, a select gate mask is used to selectively etch the oxide 200 such that trenches are created in the planarized array directly over the rows of memory cells. FIG. 3F is a layout diagram of two rows of memory cells wherein a select gate mask (shown as the large cross hatched area 700) is used to carry out this step. The control gates are shown as regions 70 extending in the vertical dimension; the n+ buried source diffusions are shown as regions 120 extending in the vertical dimension forming dedicated source bitlines; the n+ buried drain diffusions (the regions in between two adjacent control gates) are shown as regions 30 extending in the vertical dimension forming dedicated drain bitlines; and the floating gates are shown as the cross hatched areas 60 underneath the control gates 70.

Photoresist is used as the select gate mask 700, and similar to contact hole definition, the photoresist 700 covers the entire array other than areas 210 wherein the third layer of poly (select gate) is later deposited. Through a dry etch step, the oxide exposed in areas 210 (i.e., oxide 200 in FIG. 3E) is etched back until the buffer poly directly over the stacks of poly is first exposed. At that point, additional etching is carried out to remove the oxide in areas between adjacent stacks of poly. In this manner trenches are created (defined by regions 210) in the planarized surface of the array. As shown, trenches 210 extend in the horizontal dimension over the stacks of first and second layer poly.

Figure 3G:
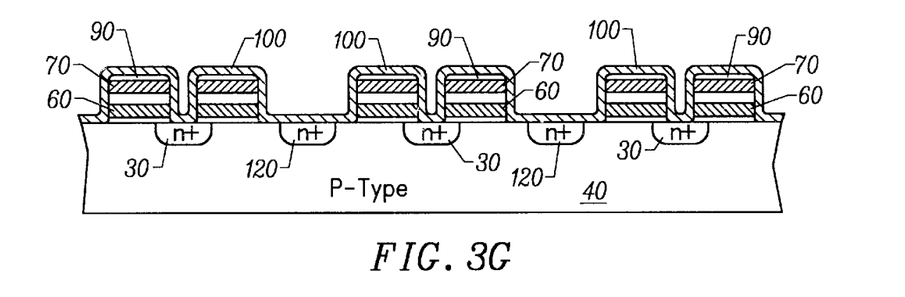
Figure 3H:
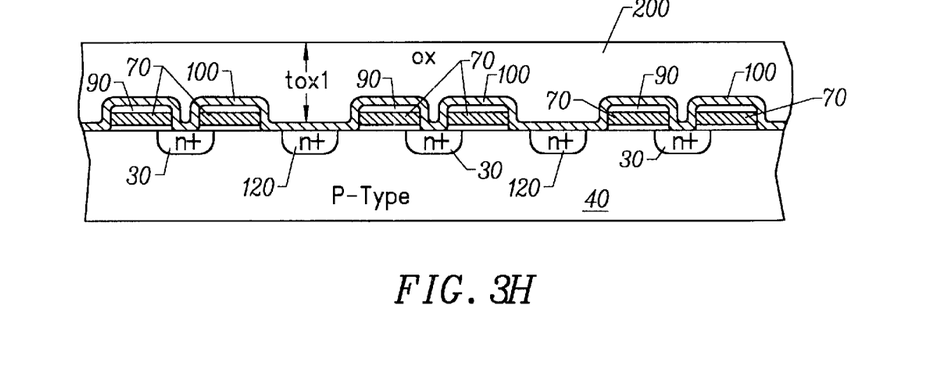

FIGS. 3G and 3H show cross sections of the FIG. 3F array across respective lines A—A and B—B after the oxide etch and removal of the photoresist mask 700. FIG. 3G corresponds to the trench area 210 in FIG. 3E, and shows the oxide previously used in planarizing the array (i.e., oxide 200 in FIG. 3E) being absent. FIG. 3H shows the oxide 200 to be intact in the areas between the trenches 210 where photoresist 700 covered the array.

In this step, as in the source diffusion definition step, the buffer poly layer of the ONP composite layer 100 is used to control the etching of the oxide in the trench regions 210. As indicated above, in the trench regions 210, those portions of the ONP composite layer directly over the poly stacks are exposed prior to the portions in the areas between the stacks of poly. As a result, this etching step will result in removal of a certain amount of the buffer poly directly over the stacks of poly. The thickness of the buffer poly need to be properly selected to account for such losses.

In determining the extent of buffer poly removed in this step, the above described two parameters, namely, oxide etch back uniformity of ±10%, and oxide to poly selectivity of 30 to 1, are used. Assuming $t_{ox2}$ is 4000 Å, etching the 4000 Å in the between the poly stack will result in removal of 133 Å of the buffer poly in the areas directly over the poly stacks. Thus, in these areas, of the original 400 Å of buffer poly, approximately 147 Å remains, given that 120 Å was removed in the previous oxide etch step.

Figure 3I:
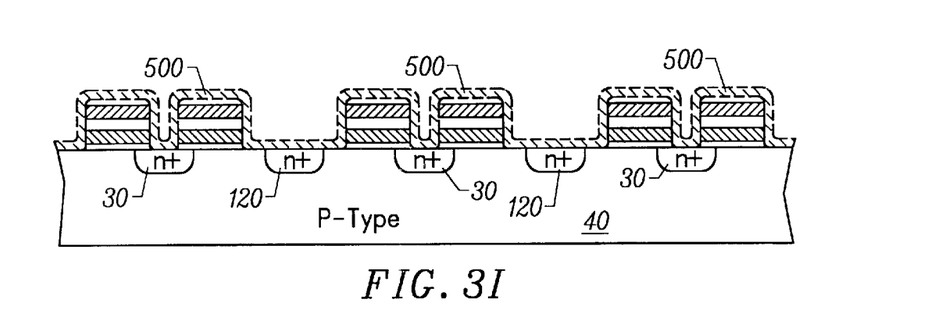

Next, the ONP composite layer is converted to an ONO composite layer by oxidizing the top buffer poly layer through a wet oxidation cycle. By oxidizing the conductive buffer polysilicon layer, it is rendered non-conductive thereby eliminating the potential for shorting the select gates which are later deposited on top of the ONO composite layer. Layer 500 in FIG. 3I is intended to show an oxidized ONP composite layer, or simply the ONO composite layer.

This oxidation step results in a top oxide layer having a thickness approximately twice that of the buffer poly layer. Accordingly, in the above example, the 147 Å and 280 Å of buffer poly in the areas over the poly stacks and between the poly stacks, respectively, convert to 294 Å and 560 Å of oxide, respectively. Note that this oxidation cycle also oxidizes the buffer poly layer in regions other than trenches 210 (i.e., regions exemplified by line B—B in FIG. 3F) despite the thick oxide layer covering the buffer poly in these regions.

Figure 3J:
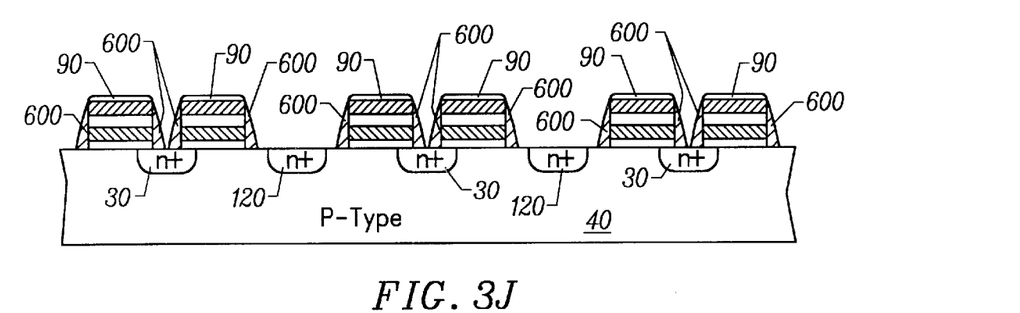

In FIG. 3J, the ONO composite layer 500 is anisotropically etched to form the ONO spacers 600 along the side walls of the poly stacks. The ONO spacers 600 may have a thickness in the range of 400 Å–500 Å at the bottom. A thickness greater than 1,500 Å reduces the read and programming currents of the cell and thus is undesirable.

Figure 4A:
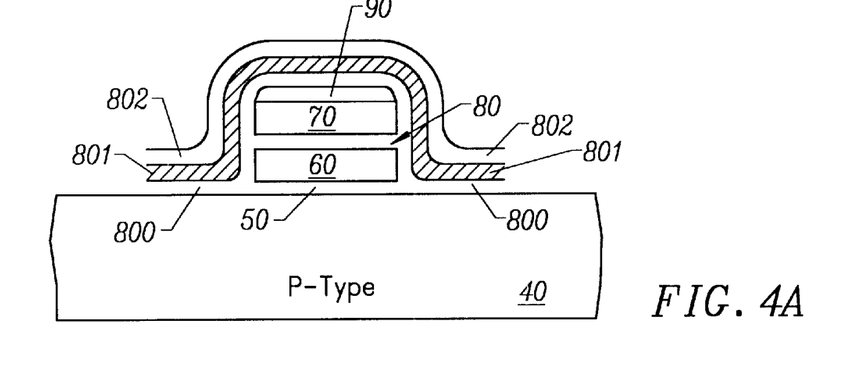
FIGS. 4A–4D show in more detail the steps carried out in forming the ONO spacers 600 in FIG. 3J.
Figure 4B:
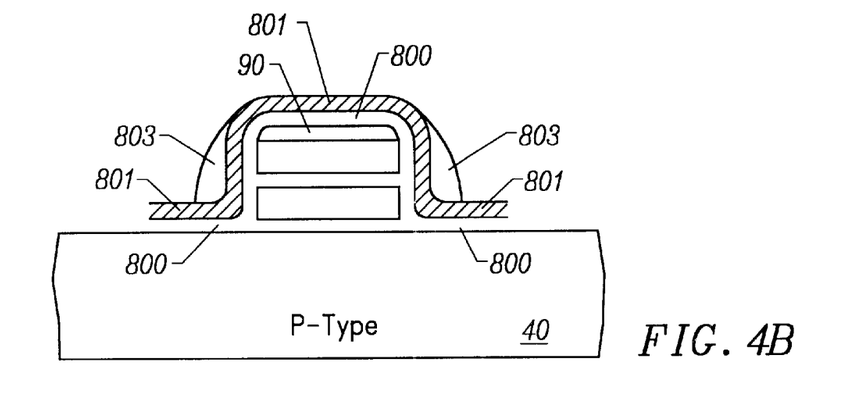
Figure 4C:
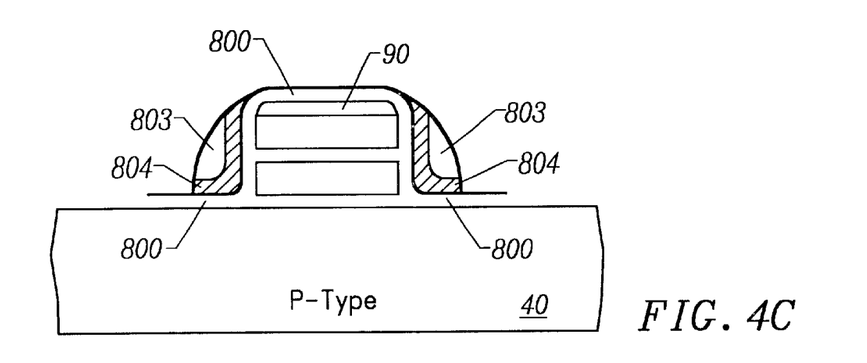
Figure 4D:
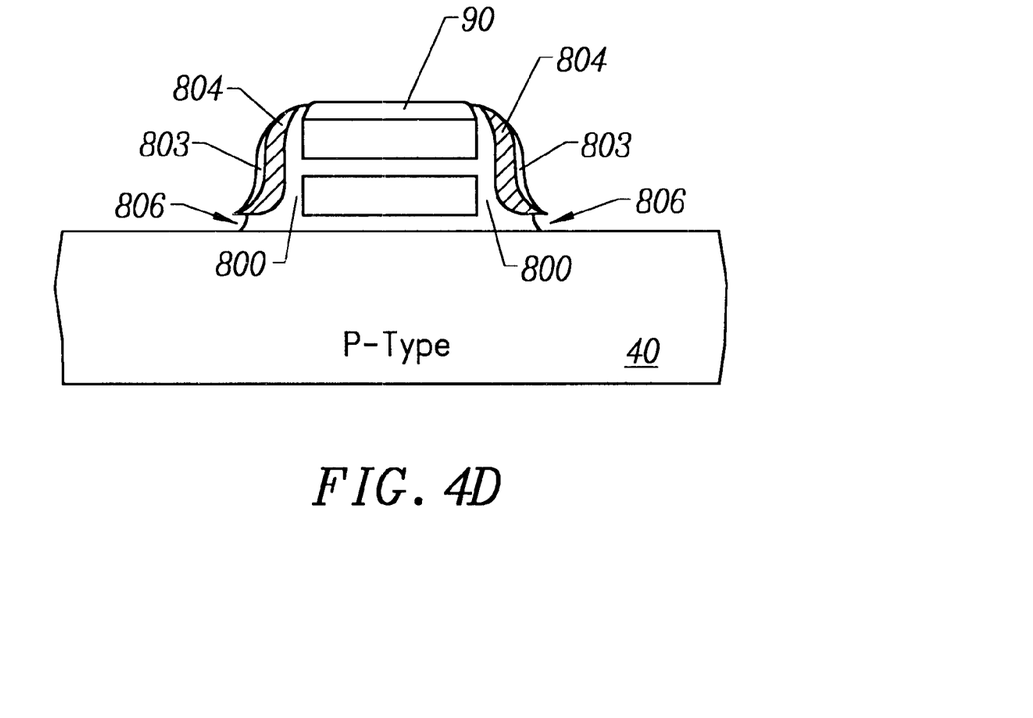

FIGS. 4A–4D show in more detail the steps carried out in forming the ONO spacers 600 (FIG. 3J). FIG. 4A shows a stack of polysilicon which corresponds to any one of the six poly stacks in FIG. 3I. The three layers forming the ONO composite layer 500 (FIG. 3I) are shown in FIG. 4A as Oxide layer 800, nitride layer 801, and oxide layer 802. In FIG. 4B, the top oxide layer 802 is anisotropically etched resulting in the formation of the oxide spacers 803. In FIG. 4C, the nitride layer 801 (FIG. 4B) is etched, resulting in removal of all the nitride other than the nitride "feet" 804 under oxide spacers 803. In FIG. 4D, the oxide layer 800 (FIG. 4C) is etched using a wet dip process, resulting in the undercuts 806 under the nitride feet 804. In the absence of the ONO spacers (which is made up of the oxide 800, the nitride foot 804, and the oxide 803), similar undercuts would occur under poly 1 which ultimately would result in cusping of poly 1. The ONO spacers also prevent cusping of poly 1 during the poly 3 (select gate) oxidation cycle for similar reasons. Further, the nitride feet 804 protect the edges of the poly stacks from subsequent processing steps.

Figure 3K:
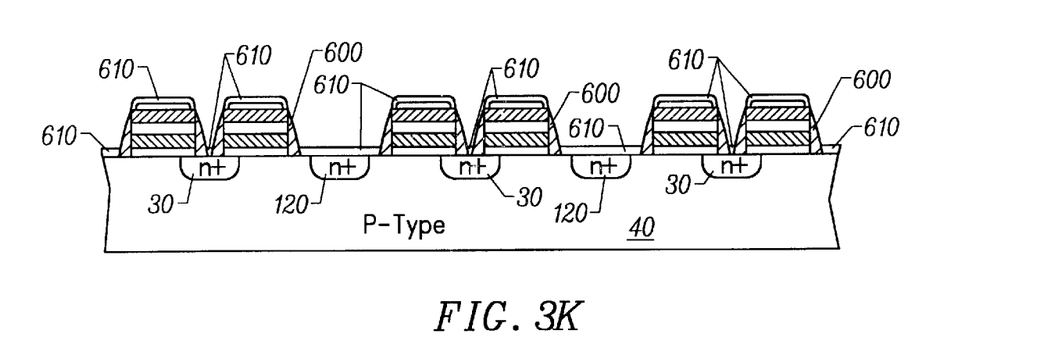
Figure 4E:
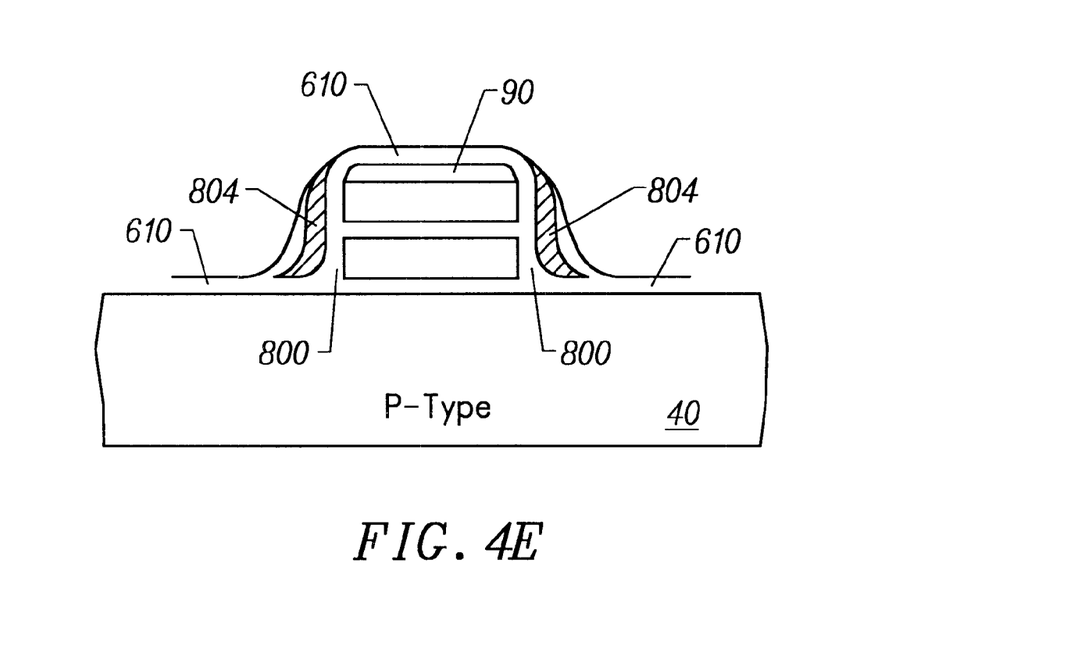
FIG. 4E shows a more detailed cross section of a stack of polysilicon corresponding to any one of the six poly stacks in FIG. 3K

In FIG. 3K, through a thermal oxidation cycle, select gate oxide 610 is formed over the row of poly stacks. FIG. 4E shows in more detail a stack of polysilicon corresponding to any one of the six poly stacks in FIG. 3K. As shown, oxide 610 creates a continuous and smooth surface over which poly 3 is late deposited. The thickness of the oxide 610 is in the range of 70 Å to 200 Å, with a preferred thickness of approximately 80 Å. Note, that the oxidation cycle does not result in growth of oxide in the areas directly over the nitride feet 804 since nitride prevents growth of oxide.

In an alternate embodiment, a thin ONO composite layer, in the range of 70–200 Å, is deposited as the select gate dielectric 610. Depositing of the ONO composite layer does not require the use of the high temperature cycle (600° C.–900° C.) associated with the high thermal oxidation cycle. Such high temperature cycles adversely effect the source/drain diffusions in the periphery and the array by causing excessive side diffusion. This results in $L_{eff}$ becoming shorter than the target $L_{eff}$.

Figure 3L:
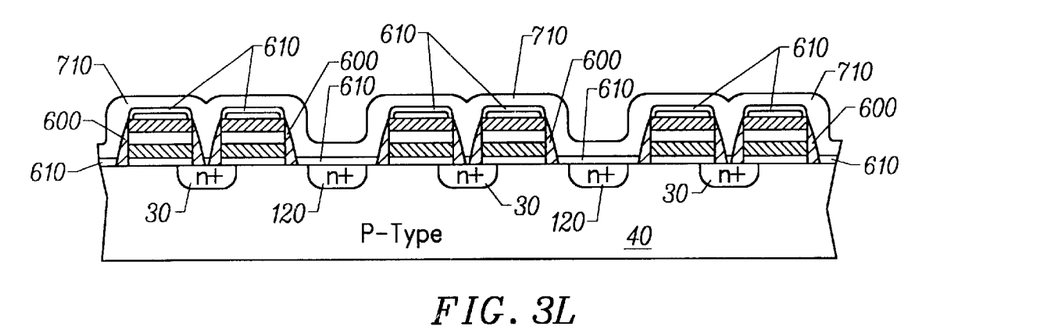

In FIG. 3L, a third layer of poly 710 (poly 3), having a thickness of approximately 8,000 Å, is deposited over the array using the Low Pressure Chemical Vapor Deposition (LPCVD) process. The poly 3 is subsequently doped with phosphorous and then etched back without using a photoresist mask. The poly 3 is uniformly etched back until the first underlying layer, namely, oxide 200 in FIG. 3H, is first exposed. Once the oxide 200 is exposed, additional etching is carried out (e.g. another 10% removal of poly 3) to ensure that the poly 3 is fully removed from over the array areas covered with oxide 200. Because of the narrow width of the trench area 210 (in the range of 0.25–0.5 μm), the trench 210 remains filled with poly 3 after the etch step. In this manner, the poly 3 in trenches 210 form select gates or wordlines 710 which run across the array in the horizontal direction.

With poly 2 forming the control gate of the periphery transistors, next, contact holes are formed in the periphery region while the array region is covered with photoresist (this step is not shown). The photoresist is then removed from over the array and Metal 1 is deposited over both the periphery and array regions using the conventional metal sputtering process. The deposited metal 1 is subsequently defined through a metal 1 masking step in both the array and the periphery regions (this step is also not shown). In this manner, contact is made between the poly 3 and the overlying metal 1 without using any contact holes. Three advantages are realized with such structure: (1) the RC time delay associated with poly wordlines is significantly reduced, (2)

a smaller array size is achieved because the metal plus contact pitch associated with the conventional method of making contact between poly 3 and metal is reduced to solely a metal pitch, and (3) a more misalignment tolerant process is achieved since the contact between metal 1 and poly 3 is made without use of a contact hole (i.e., contact is made by simply overlaying poly 3 with metal 1 providing for a greater metal 1 misalignment tolerance with respect to poly 3).

In contact-less arrays, such as that of the present invention, the source and drain diffusion bitlines, which extend across the array, are strapped with metal to reduce the large resistance associated with such diffusion lines. Metal 2 and contacts may be used to strap the drain and source diffusion bitlines. Conventional process steps are carried out to implement this portion of the fabrication process.

The processing steps depicted by FIGS. 3B–3L collectively represent a flash process module which can easily be integrated with any conventional ETOX process, thereby facilitating transporting these process steps to any manufacturing foundry using the ETOX process.

The above description of the present invention is intended to be illustrative and not limiting. The invention is further intended to include all variations and modifications falling within the scope of the appended claims.

What is claimed is:

1. A contact-less array of non-volatile memory cells, comprising:

a row of pairs of stacks of first and second polysilicon layers over a silicon substrate, the first layer polysilicon being insulated from the substrate, and the second layer polysilicon being insulated from the first layer polysilicon;

a drain region in the substrate between the two stacks in each pair of polysilicon stacks, the drain region being self-aligned to the edges of the two stacks;

a source region in the substrate between two adjacent pairs of polysilicon stacks, the source region being self-aligned to side-wall spacers formed adjacent to edges of the polysilicon stacks, such that the source region is laterally spaced an equal distance from the edges of the two stacks of polysilicon between which the source region is located;

a third layer of polysilicon over but insulated from the polysilicon stacks by an oxide-nitride-oxide (ONO) composite layer, the third layer of polysilicon forming a wordline in the array; and an ONO side-wall spacer adjacent to each edge of the stacks of polysilicon for insulating the side-walls of each polysilicon stack from the third layer polysilicon, wherein the distance between two adjacent pairs of polysilicon stacks is greater than the distance between the two stacks in each pair of polysilicon stacks.

2. The array of claim 1 wherein the memory cells are split gate cells and every two adjacent split gate cells along the row are mirror images of one another.

3. The array of claim 1 wherein the distance between two adjacent pairs of polysilicon stacks is three times the distance between the two stacks in each pair of polysilicon stacks.

4. The array of claim 1 further comprising a layer of metal overlying the third layer of polysilicon.

5. The array of claim 4 further comprising a layer of tungsten silicide overlying the second layer of polysilicon.

6. The array of claim 1 wherein the pairs of stacks of first and second layer of polysilicon are formed in accordance with conventional ETOX process.

7. The array of claim 1 wherein the drain region is formed by covering the silicon substrate regions between adjacent pairs of polysilicon stacks with photoresist and implanting Arsenic into the exposed silicon substrate regions.

8. The array of claim 1 wherein the source region is formed by implanting Arsenic through a window formed by oxide side-wall spacers temporarily formed adjacent to each polysilicon stack whereby the source region is self-aligned to the side-wall spacers.

9. The array of claim 8 wherein a composite layer of, in the order from bottom to top, HTO-Nitride-Polysilicon (ONP) is formed between the oxide side-wall spacers and the stacks of polysilicon prior to source region formation.

10. The array of claim 9 wherein the top polysilicon layer in the ONP composite layer is rendered non-conductive before deposition of the third layer polysilicon.

11. The array of claim 10 wherein the top polysilicon layer in the ONP composite layer is rendered non-conductive by oxidizing the polysilicon layer.

12. The array of claim 1 wherein the array of memory cells is planarized before the third layer of polysilicon is deposited.

13. The array of claim 12 wherein the wordline is formed by depositing the third layer of polysilicon in a trench formed in the planarized array over the row of polysilicon stacks.

14. The array of claim 12 wherein the Chemical Mechanical Polish (CMP) technique or the resist etch back process is used to planarize the array.

15. A contact-less array of non-volatile memory cells comprising:

three stacks S1, S2 and S3 of first and second polysilicon layers over a silicon substrate along a row, the first layer polysilicon being insulated from the substrate, and the second layer polysilicon being insulated from the first layer polysilicon;

a drain region in the substrate between the stacks S1 and S2, the drain region being self-aligned to the edges of the stacks S1 and S2;

a source region in the substrate between the stacks S2 and S3, the source region being self-aligned to side-wall spacers formed adjacent to edges of the stacks S2 and S3, such that the source region is laterally spaced an equal distance from the edges of the stacks S2 and S3;

a third layer of polysilicon over but insulated from the polysilicon stacks by an oxide-nitride-oxide (ONO) composite layer, the third layer of polysilicon forming a wordline in the array; and an ONO side-wall spacer adjacent to each edge of the polysilicon stacks for insulating the side-walls of each polysilicon stack from the third layer polysilicon, wherein the distance between the stacks S2 and S3 is greater than the distance between the stacks S1 and S2.

16. The array of claim 15 wherein the distance between the stacks S2 and S3 is three times the distance between the stacks S1 and S2.

17. The array of claim 15 wherein the memory cells are split gate cells and every two adjacent split gate cells along the row are mirror images of one another.

* * * * *